(12) United States Patent  
Clark et al.

(10) Patent No.: US 8,461,853 B2  
(45) Date of Patent: Jun. 11, 2013

(54) HIGH VOLTAGE LIQUID DIELECTRIC TEST VESSEL

(75) Inventors: Simon Clark, Folkestone (GB); Simon Haynes, Ashford (GB)

(73) Assignee: Megger Instruments Limited, Dover, Kent (GB)

( * ) Notice: Subject to any disclaimer, the term of this patent is extended or adjusted under 35 U.S.C. 154(b) by 251 days.

(21) Appl. No.: 12/889,605

(22) Filed: Sep. 24, 2010

(65) Prior Publication Data

US 2011/0285413 A1 Nov. 24, 2011

(30) Foreign Application Priority Data

May 18, 2010 (GB) .................................. 1008285.7

(51) Int. Cl.
*G01R 27/08* (2006.01)

(52) U.S. Cl.
USPC ........................................................... 324/693

(58) Field of Classification Search
USPC ........................................................... 324/693
See application file for complete search history.

(56) References Cited

U.S. PATENT DOCUMENTS

| | | | | |
|---|---|---|---|---|
| 1,870,282 A * | 8/1932 | Cover | ............................ | 324/663 |
| 2,401,287 A * | 5/1946 | Yant et al. | .................. | 205/785.5 |
| 2,567,921 A * | 9/1951 | Boehm, Jr. | ..................... | 324/555 |
| 2,836,792 A * | 5/1958 | Weber | ............................ | 324/686 |
| 3,037,164 A * | 5/1962 | Doble et al. | ................... | 324/553 |
| 3,903,460 A * | 9/1975 | Tsacoyeanes et al. | ........ | 361/327 |
| 3,996,512 A * | 12/1976 | Baur | ............................... | 324/533 |
| 4,470,007 A * | 9/1984 | Baur et al. | ...................... | 324/553 |
| 4,702,248 A * | 10/1987 | Mestas et al. | ...................... | 601/4 |
| 4,730,614 A * | 3/1988 | Lacruche et al. | .................. | 601/4 |
| 7,842,171 B2 * | 11/2010 | Muhr et al. | .................... | 204/242 |
| 2008/0243198 A1* | 10/2008 | Pederson | ........................... | 607/2 |
| 2011/0200738 A1* | 8/2011 | Pederson et al. | ............... | 427/2.1 |

FOREIGN PATENT DOCUMENTS

WO WO 2009/149866 A1 12/2009

* cited by examiner

*Primary Examiner* — Jermele M Hollington  
*Assistant Examiner* — Demetrius Pretlow  
(74) *Attorney, Agent, or Firm* — Sunstein Kann Murphy & Timbers LLP

(57) ABSTRACT

A test vessel assembly comprises a central test vessel defining a chamber in which a sample to be tested may be stored. A pair of side adjustable electrodes is received in the chamber and immersed in the sample under test to determine the breakdown voltage of the sample. A gap between the electrodes can be adjusted by respective electrode adjusting moved in and out of the test vessel by rotation of an associated adjusting wheel. To prevent the breakdown in air rather than in the sample, care is taken to ensure sufficiently large creepage and clearance distances between the connections to the electrodes and from the connections to the electrodes to a wall of the test chamber. To this end, the adjusting wheels include convolutions that mesh with corresponding convolutions in the test vessel.

12 Claims, 4 Drawing Sheets

HIGH VOLTAGE LIQUID DIELECTRIC TEST VESSEL

This application claims priority to British Patent Application 1008285.7, filed May 18, 2010, which is incorporated herein by reference.

FIELD OF THE INVENTION

The invention relates to high voltage liquid dielectric test vessels, and in particular such vessels having side adjustable electrodes.

BACKGROUND TO THE INVENTION

Oil is frequently used as an insulator in high voltage equipment, such as transformers. Over time, the insulating properties of the oil degenerate due to contamination by water, dust, or other products emanating from other materials within the transformer. It is known to test the insulating properties of this oil in an instrument called an oil test set. A sample of oil to be tested is contained within a test vessel within the oil test set. In such a test vessel, a steadily increasing voltage is applied across the sample of the oil until a spark flashes through the oil as a result of it breaking down electrically. The voltage at which this occurs is known as the breakdown voltage.

In some designs, the test vessel has a pair of electrodes mounted at the sides of the vessel in an adjustable manner so that a gap between the electrodes can be adjusted. In alternative designs, with the electrodes depending downwardly from a lid, for example, the electrodes are removed together with the lid when it is removed to replace the oil sample in the test vessel. Since the electrodes have been immersed in the oil sample, they are prone to dripping when removed.

Care must be taken in designing oil test vessels, because the breakdown voltage of air is considerably less than that of the oil under test. As a result, if there is insufficient insulation between the electrodes and the air surrounding the test vessel as compared to the gap between the electrodes in the oil, then the spark will not flash across the oil as desired, but will discharge through the atmosphere. This would lead to erroneous test results.

SUMMARY OF THE INVENTION

According to the invention, there is provided a high voltage liquid dielectric test vessel assembly, comprising:
  a vessel having a sidewall defining a chamber for receiving a liquid dielectric under test;
  a first electrode assembly including a first electrode disposed within the chamber; and
  a second electrode assembly including a second electrode disposed within the chamber;
  wherein the first electrode assembly comprises a first adjustment mechanism for moving the first electrode relative to the second electrode for adjusting a gap therebetween, the first adjustment mechanism comprising:
a first conductive shaft extending through the sidewall and having a distal end attached to the first electrode; and
  a first adjusting wheel interengaged with the first shaft such that rotation of the first wheel is translated into axial reciprocation of the first shaft;
  wherein the first adjusting wheel is mounted to the vessel, with convolutions in the first adjusting wheel meshing with convolutions in the vessel.

The arrangement of the adjusting wheel, particularly the meshing of its convolutions with those of the vessel, is such that the air path from the conductive shaft to the periphery of the vessel is significantly increased, resulting in a much reduced likelihood of an inadvertent discharge through the air. This means that the test vessel assembly can be reduced in size whilst retaining protection against discharge through the air. Additionally or alternatively, the test voltage may be increased. The arrangement is such that the gap between the electrodes may be adjusted with great accuracy yet mitigating against breakdown in air.

Typically, the test vessel assembly further comprises a first horn cover connected to the test vessel and shrouding the proximal end of the first conductive shaft, which proximal end is adapted to be conductively connected to a first electrical contact of an insulated horn within a test assembly to which the test vessel is mounted, in use, the first horn cover including convolutions that mesh with convolutions of the first adjusting wheel.

Preferably, the second electrode assembly comprises a second adjustment mechanism for moving the second electrode relative to the first electrode for adjusting the gap therebetween, the second adjustment mechanism comprising:
  a second conductive shaft extending through the sidewall at a point substantially opposite the first conductive shaft and having a distal end attached to the second electrode; and
  a second adjusting wheel interengaged with the second shaft such that rotation of the second wheel is translated into axial reciprocation of the second shaft relative to the vessel;
  wherein the second adjusting wheel is mounted to the vessel, with convolutions in the second adjusting wheel meshing with convolutions in the vessel.

Although it is preferable for each of the electrode assemblies to include a respective adjustment mechanism, it will be understood that one of the electrodes may instead be fixed.

Where the test vessel assembly includes a second adjustment mechanism, a second horn cover may be connected to the test vessel and shroud the proximal end of the second conductive shaft, which proximal end is adapted to be conductively connected to a second electrical contact of an insulated horn within a test assembly to which the test vessel is mounted, in use, the second horn cover including convolutions that mesh with convolutions of the second adjusting wheel. So, as with the meshing convolutions of the first adjustment mechanism, the meshing convolutions of the second adjustment mechanism are such that the air path from the second conductive shaft to the periphery of the vessel is significantly increased.

Optionally, one or both adjustment mechanisms may include a resilient member mounted to the proximal end of the respective shaft for urging the shaft, ergo the associated electrode, towards the other electrode. This arrangement mitigates against backlash that might be present between the adjusting wheel and the associated shaft.

Where there is a resilient member, this may comprise a conductive spring, in which case the assembly may further comprise a conductive end cap connected to the proximal end of the associated shaft and encasing the spring. The conductive end cap helps to prevent corona discharge from the thin wire diameter of the spring by enclosing it in metal of the same voltage.

The test vessel may further comprise a pin extending transversely through one or each shaft, the pin received in an associated groove in the vessel so as to prevent rotation of the associated shaft whilst allowing the required axial reciprocation. In order to set the electrode gap, a feeler gauge may be inserted between the first and second electrodes. By preventing rotation of the shaft, scuffing of the electrodes by the feeler gauge is reduced.

An electrode may be removably attached to the distal end of the associated shaft. The provision of easily removable electrodes facilitates maintenance of the test vessel assembly as a whole and replacement of old electrodes, and fitting of different electrode shapes for different standards. Also, where the rotation of the shafts is prevented by the pin and groove arrangement, replacement of each electrode is facilitated because it can simply be unscrewed from the respective shaft without having to otherwise clamp or hold the shaft.

An adjustment mechanism may further comprise a lock for releasably preventing rotation of the adjusting wheel, thereby preventing reciprocal movement of the associated shaft. In this manner, once a desired electrode gap has been set by relative reciprocal movement of an electrode, the gap can be fixed.

An adjusting wheel may be concentrically arranged about the respective shaft. Whereas other arrangements are possible, the concentricity will help ensure that the air path to the periphery of the vessel is consistent about the circumference of the shaft.

An adjusting wheel may be rotatably free, yet axially fixed to the associated shaft, and mounted by a threaded interconnection to the vessel. Alternatively, an adjusting wheel may be rotatably free, yet axially fixed to the vessel, and mounted by a threaded interconnection to the associated shaft. In the first arrangement, the adjusting wheel moves axially relative to the vessel as it is rotated. Because the wheel is axially fixed in this embodiment to the shaft, the shaft and wheel move together in the axial direction (although the wheel may rotate relative to the shaft). In the second arrangement, the shaft moves axially relative to the adjusting wheel as the adjusting wheel is rotated. Because the wheel is axially fixed to the vessel in this embodiment, the shaft moves axially relative to the vessel.

BRIEF DESCRIPTION OF THE DRAWINGS

The invention will be described, by way of example, with reference to the accompanying drawings, in which.

DETAILED DESCRIPTION

Figure 1:
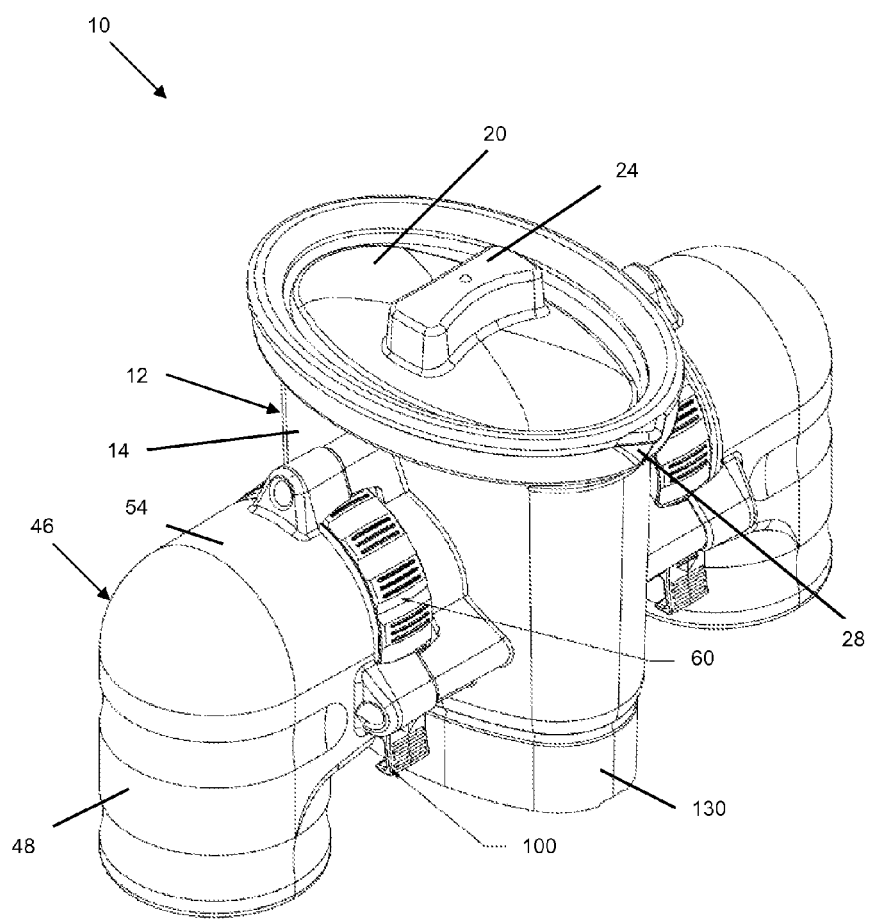
FIG. 1 is a perspective view from above of a test vessel embodying an aspect of the invention.
Figure 2:
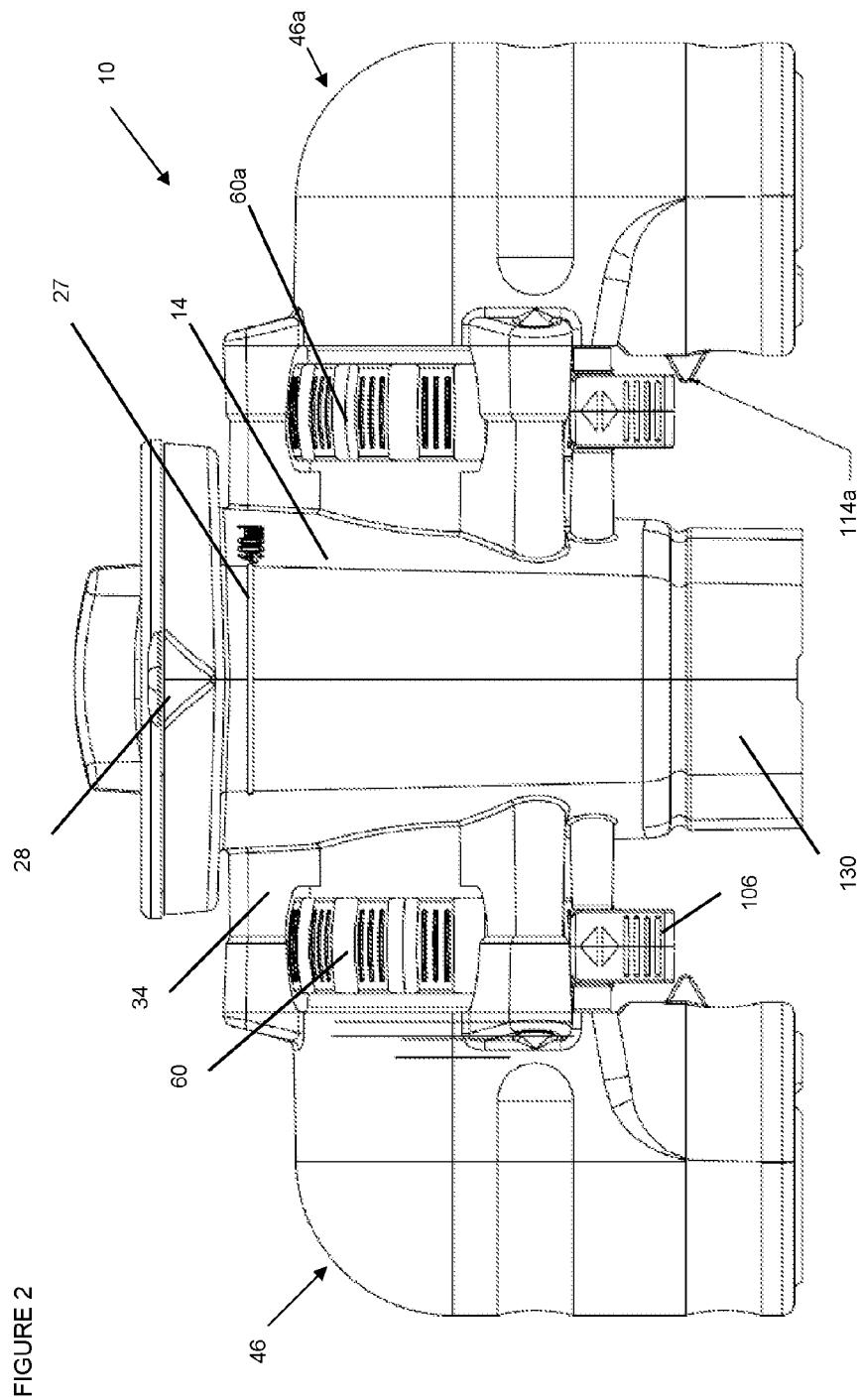
FIG. 2 is a front side elevation view of the test vessel of FIG. 1.
Figure 3:
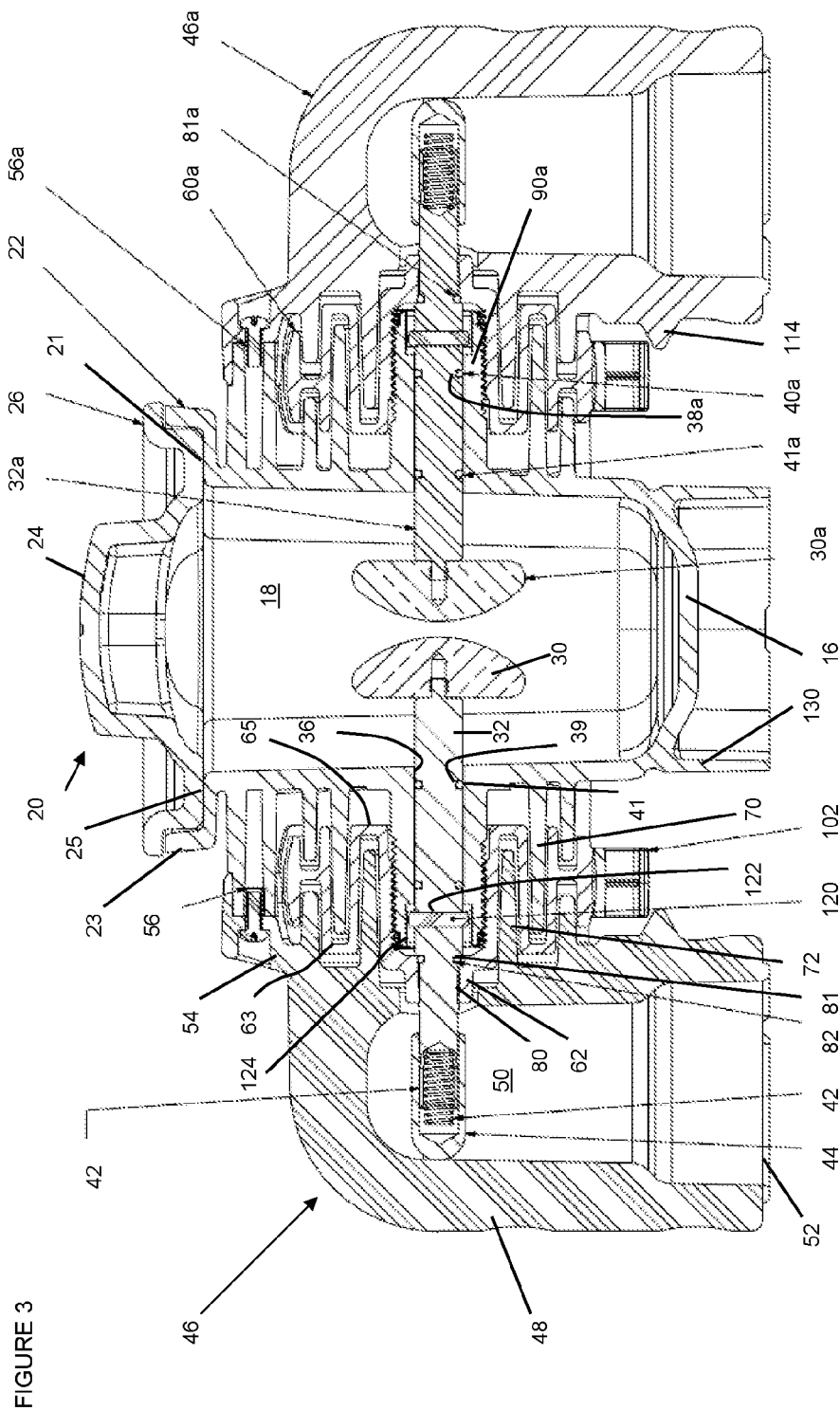
FIG. 3 is a cross-sectional view through the test vessel of FIG. 2.

By reference in particular to FIGS. 1 to 3, a test vessel assembly 10 comprises a central vessel 12 having a sidewall 14 that, together with a base 16, defines an internal chamber 18 for receiving a sample for testing. The vessel 12 has a substantially elliptical, or oval, plan profile, which provides compressive strength. A removable lid 20 rests on a horizontal shelf 21 of a rim 22 at the top of the vessel sidewall 14. The rim includes an oval riser 23. The lid includes a handle 24, a flat bottom portion 25 and a lip 26. The flat bottom 25 lies on top of the horizontal shelf 21 of the vessel, and the lip 26 sits within the oval riser 23 of the vessel.

In use, the chamber 18 is filled with a sample to be tested, such as oil, or another dielectric liquid, for example (not shown). To aid the filling process, the vessel may be made of a transparent or translucent material. A fill line 27 provides a visual indication of a desirable sample level. The vessel rim 22 includes a spout 28, which can be used for emptying the vessel after use.

First and second electrode assemblies are arranged on opposite sides of the vessel 12. Since the second assembly is a mirror image of the first assembly, the following description of the first assembly applies *mutatis mutandis* to the second assembly, which will not be described individually. Where the description requires the common respective parts to be distinguished, the reference for the part of the second assembly will be that of the first assembly but suffixed with 'a'.

The first electrode assembly comprises a first electrode 30 disposed within the chamber 18 and removably attached to a distal end of a shaft 32, for example by a threaded connection. The shaft 32 extends through the vessel sidewall 14 in a horizontal orientation, entering at a point substantially midway up the vessel 12 and in about the centre of the flatter side of the oval sidewall 14.

A reinforcing boss 34 projecting outwardly from the sidewall 14 supports the shaft 32 within a bore 36. The shaft includes annular grooves 38, 39 containing O-rings 40, 41 that maintain a seal to prevent the sample within the chamber 18 from leaking through the bore 36.

A proximal end of the shaft 32 projects outwardly from the boss 34. A metal coil spring 42 is mounted on the proximal end of the shaft for a purpose to be described below. The spring 42 is encased within a conductive end cap 44.

The first electrode assembly further comprises a horn cover 46. The horn cover 46 comprises a body portion 48 that defines a central cavity 50 having an opening 52 at a bottom end. A flange portion 54 protrudes from an upper end of the body portion 48 for removable attachment of the horn cover 46 to the reinforcing boss 34 via fasteners 56.

Figure 4:
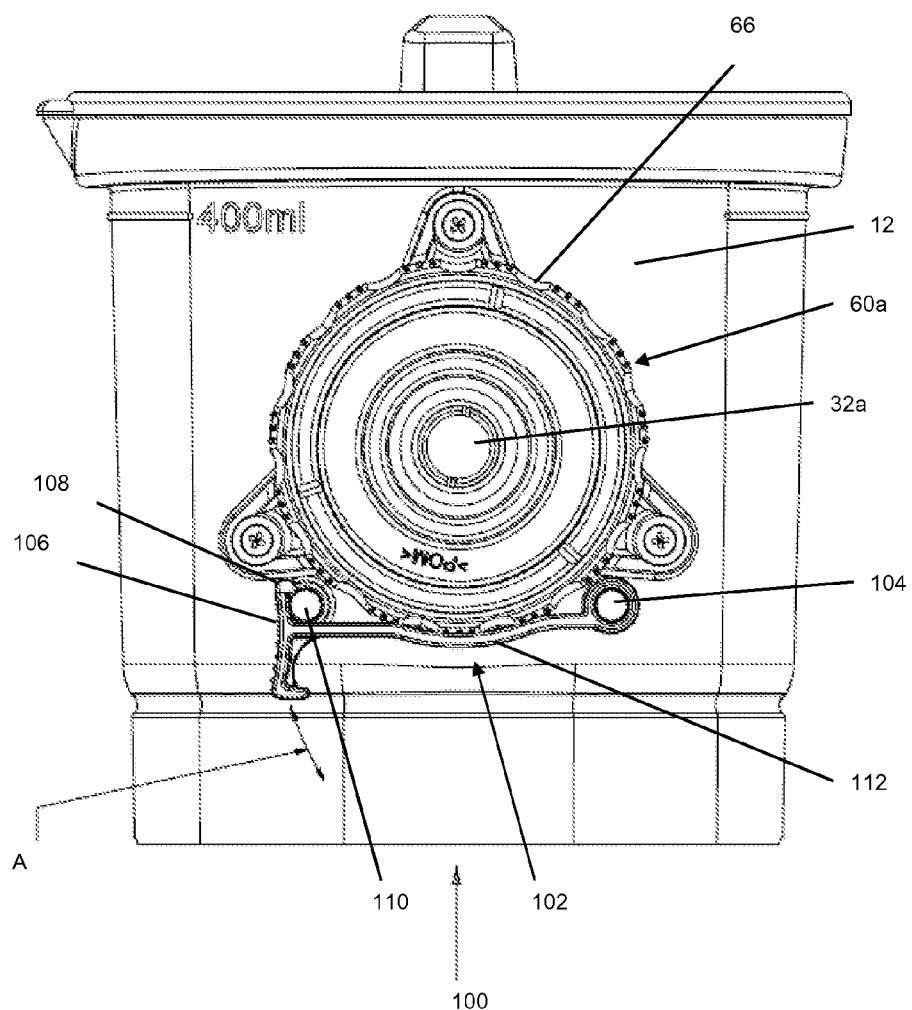
FIG. 4 is an end side elevation view of the test vessel of FIG. 1, in which a horn cover is removed to show a latch detail.

An adjusting wheel 60 is located between the vessel 12 and the horn cover 46. As best seen in FIGS. 3 and 4, the adjusting wheel 60 is arranged concentrically about the shaft 32 and sandwiched between the vessel boss 34 and the flange portion 54 of the horn cover 46. The wheel 60 comprises a central hub 62 mounted in an annular groove 80 on the shaft that allows relative rotation yet prevents relative axial movement between the wheel and the shaft. A further O-ring 81 is included in a deeper portion 82 of the groove 80.

The adjusting wheel 60 has a convoluted profile, comprising a series of peaks 63 and troughs 65 that extend in a serpentine manner out from the central hub 62 to a knurled outer circumferential surface 66.

The vessel boss 34 has a concentric series of annular ribs 70 that project out from the vessel sidewall 14 towards the horn cover 46. The horn cover 46 has a concentric series of annular ribs 72 projecting towards the vessel 12 from the flange portion 54 of the horn cover 46. The ribs 72 of the horn cover 46 nest within annular spaces between the ribs 70 of the vessel, whilst the ribs 70 of the vessel nest within annular spaces between the ribs 72 of the horn cover 46. The interdigitating ribs 70, 72 together define a serpentine space. The serpentine peaks and troughs 63, 65 of the wheel 60 fit within the serpentine space defined by the interdigitating ribs 70, 72. In other words, the adjusting wheel 60 has a convoluted profile that meshes with corresponding convoluted profiles in each of the reinforcing boss 34 of the vessel 12 and the flange portion 54 of the horn cover 46.

The adjusting wheel 60 is mounted to the vessel 12 by a threaded connection between a female thread on the wheel and a male thread on a stud 90 forming part of the boss 34 and projecting from the centre of the sidewall 14. Accordingly, the adjusting wheel 60 moves axially relative to the vessel 12 as it is rotated. Because the wheel 60 is axially fixed to the shaft 32, the shaft and wheel move together in the axial direction (although the wheel may rotate relative to the shaft). In this manner, rotation of the wheel 60 results in a translation of the first electrode 30 and therefore an adjustment of the electrode gap. A stud 90*a* is included in the second electrode assembly for the same purpose.

Instead of the wheel 60 being threaded to the vessel 12 via the post 90 and being rotatably free yet axially fixed on the shaft 32, the wheel 60 may be rotatably free yet axially fixed to the vessel 12 and mounted by a threaded interconnection to the shaft 32. In this alternative arrangement, the shaft 32 moves axially relative to the adjusting wheel 60 as the adjusting wheel is rotated. Because the wheel 60 is axially fixed to the vessel 12 in this embodiment, the shaft 32 moves axially relative to the vessel 12, again resulting in a translation of the first electrode 30 and therefore an adjustment of the electrode gap.

The O-ring 81 also allows for a little articulation between the shaft 32 and the stud 90, affording smoother adjustment of the electrode gap. The relatively large diameter of the adjusting wheel 60 enables accurate electrode adjustment.

The springs 42, 42*a* pre-load the adjusting assemblies to avoid backlash while adjusting the electrode gap The shelf 21 of the vessel rim 22 is wider in the direction of the electrodes 30, 30*a* in order to stiffen up the assembly, maintaining a more constant electrode gap. Further stiffening is also provided by the concentric ribs 70 that mesh with the adjusting wheel 60. The lid 20 has been designed not to exert pressure in the direction of the electrodes 30, 30*a*, so it should not distort the test vessel 12 and upset the electrode gap.

As best seen in FIG. 4, a lock mechanism 100 comprises a latch 102 pivotally mounted on a pivot post 104 that projects from the vessel sidewall 14 at a position outside the circumference of the adjusting wheel 60. A tab 106 and an associated pawl 108 are located on a free end of the latch, opposite to the pivot post 104. In a locked position, the pawl 108 resiliently engages a latch post 110 and a middle portion 112 of the latch engages a part of the outer circumference 66 of the wheel 60. Friction between the middle portion 112 of the latch 102 and the outer circumference of the wheel 60 resists rotation of the wheel and thus locks the shaft 32 and the associated electrode 30 in position.

A user may release the lock mechanism 100 by pushing down on the tab 106 which releases the pawl 108 from engagement with the latch post 110. The latch 102 can thus be rotated (arrow A) out of engagement with the wheel 60 to an unlocked position. A protuberance 114 projecting from the horn cover 46 provides an end stop to the rotation of the latch 102.

The skilled person will understand that other locking mechanisms could be employed to prevent rotation of the adjusting wheel 60 to lock the position of the electrode 30.

The shaft 32 is prevented from rotating by means of a pin 120 mounted in a transverse hole 122 through the shaft. The pin 120 is longer than the shaft diameter, so that a portion of the pin 120 projects out of either side of the shaft 32. The projecting portions of the pin 120 are located in a slotted groove 124 in the post 90 so as to prevent rotation of the shaft whilst allowing the required axial reciprocation. This arrangement helps in the case where the electrode 30 is removably attached to the shaft 32 by a threaded connection, because the electrode can be screwed on to or off of the shaft without having to clamp or otherwise hold the shaft.

In use, the test vessel assembly 10 would be placed in a test chamber having a pair of insulated horns that each shield a respective spring-loaded electrical contact at their upper end (not shown). The horn covers 46, 46*a*, together with the vessel 12, would be lowered into position over the horns with a snug fit. An electrical connection would be established between the contacts and the respective shafts 32, 32*a*, possibly via the respective end covers 44, 44*a*. The thickness and height of the horn covers 46, 46*a* has been selected to complement the air gap from the adjusting rings to a metal wall of the test chamber.

In use, the level of the sample under test would be sufficient to cover both of the electrodes 30, 30*a*.

In order to set the electrode gap, a feeler gauge (not shown) may be inserted between the first and second electrodes 30, 30*a*. An adjusting wheel 60, 60*a* would be rotated to move the associated shaft 32, 32*a* in or out of the vessel 12 to move the respective electrodes 30, 30*a*. Scuffing of the electrodes 30, 30*a* by the feeler gauge is reduced by virtue of the fact that rotation of the shaft is prevented. Once the electrode gap has been set, the user would push an locking mechanism 100 to the locked position to prevent inadvertent further adjustment.

A steadily increasing test voltage would be applied via the horns, through the shafts 32, 32*a*, to the electrodes 30, 30*a* at their ends. The steadily increasing voltage is applied across the sample until a spark flashes through the sample as a result of it breaking down electrically. The breakdown voltage for that particular sample will thus have been determined.

The provision of the end caps 44, 44*a* enclosing the springs 42, 42*a* mitigates against corona discharge from the thin wire diameter of the springs by enclosing them in metal of the same voltage.

The shortest air distances between the connections to electrodes 30, 30*a*, or between these connections and the wall of a metal enclosure within which the test vessel 12 is located during testing, has been optimised to accommodate 100 kVrms between electrodes at an altitude of 1 km, and 50 kVrms between an electrode and the test chamber wall at an altitude of 1 km. To avoid breakdown in air, rather than the test sample, the air path from the connections to electrodes 30, 30*a* to the outer edge of the test vessel assembly 10 is increased by providing the convolutions on the adjusting wheels 60, 60*a*.

This is also the reason for a skirt 130 at the bottom of the test vessel 12, which mounts, in use, on a corresponding raised area (not shown) of the test chamber floor beneath it. The raised area may house a temperature sensor. The base 16 of the internal vessel chamber 18 may include a thinned area to provide a low thermal resistance path to the vessel contents for the temperature sensor. An additional small skirt surrounding the thinned area of the base 16 may trap a very small volume of air between the raised area and the thinned area, providing a low thermal resistance and therefore improved temperature measurement accuracy. In addition, the skirt 130 provides increased rigidity to the assembly and prevents draughts under the vessel 12 from upsetting temperature measurements.

The meshing convolutions of the adjusting wheels 60, 60*a* and the respective horn covers 46, 46*a* and the vessel 12, plus the skirt 130 each increase the creepage and clearance distances across the vessel from the connections from one electrode 30 to the connections from the other 30*a*, and to the test chamber wall. As a result, the test vessel assembly 10 may be operated at increased voltages, and/or the assembly 10 and associated test chamber may be reduced in size, resulting in a lighter-weight instrument.

Although the vessel has been described in conjunction with two similar adjustable electrode assemblies, it will be understood that the objective of adjusting the electrode gap may be achieved by having just a single adjustment mechanism, the second electrode being fixed in position.

The test vessel assembly 10 has been designed to accommodate several standards at once with a common design. The vessel assembly might be used in conjunction with a motorised stirrer option or a magnetic bean stirrer option.

Preferably, the test assembly 10 is constructed using plastic mouldings. For example, the test vessel 12, including the rim 22 and skirt 130 and the reinforcing bosses 34, 34a may be moulded as an integral unit from clear material. The horn covers 46, 46a may each be moulded integrally with the respective ribs 72 and protrusions 114. Plastic materials are more robust and lighter in weight than glass, yet can also be chemically inert and resistant to cleaning agents. Moulding enables the smooth filleting of corners for ease of cleaning, and is also inexpensive.

An optional oval, plastic baffle (not shown) might be suspended from the test vessel lid 20 for example by suspension pillars depending downwardly from the underside of the lid, so as to rest on the surface of the oil in the vessel 12 thereby excluding air from the surface of the oil in the vessel. This satisfies a requirement of one particular test vessel standard in which there must be no air in contact with the surface of the oil in the vessel.

Typically, the shafts 32, 32a connecting the electrodes 30, 30a to the contacts in the horns are made of conductive material. However, the shafts 32, 32a could be made of non-conductive material per se but carry a conductor, for example through a hollow lumen.

Also, it will be understood that the principles enunciated could be modified for application to a flow-through test, such as for process monitoring (rather than the testing of a static sample as described). This might require modification of some parts and could require the lid to be sealed.

The exemplary internal chamber 18 has a capacity of 400 ml. It will be appreciated that other capacities could equally be employed, with appropriate modification of the remainder of the apparatus. For example, a 150 ml capacity chamber 18 is also envisaged.

The invention claimed is:

1. A high voltage liquid dielectric test vessel assembly, comprising:
    a vessel having a sidewall defining a chamber for receiving a liquid dielectric under test;
    a first electrode assembly, including a first electrode disposed within the chamber; and
    a second electrode assembly, including a second electrode disposed within the chamber;
    wherein the first electrode assembly comprises a first adjustment mechanism for moving the first electrode relative to the second electrode for adjusting a gap therebetween, the first adjustment mechanism comprising:
        a first conductive shaft extending through the sidewall and having a distal end attached to the first electrode; and
        a first adjusting wheel mounted to the vessel and interengaged with the first shaft such that rotation of the first wheel is translated into axial reciprocation of the first shaft relative to the vessel;
        wherein the first adjusting wheel is mounted to the vessel, with convolutions in the first adjusting wheel meshing with convolutions in the vessel, the convolutions providing a path through the atmosphere, from the first electrode to the second electrode, that has a higher breakdown voltage than the liquid dielectric under test in the gap between the electrodes.

2. The test vessel assembly of claim 1, further comprising a first horn cover connected to the test vessel and shrouding a proximal end of the first conductive shaft, which proximal end is adapted to be conductively connected to a first electrical contact of an insulated horn within a test assembly to which the test vessel is mounted, in use, the first horn cover including convolutions that mesh with convolutions of the first adjusting wheel.

3. The test vessel assembly of claim 1, wherein the second electrode assembly comprises a second adjustment mechanism for moving the second electrode relative to the first electrode for adjusting the gap therebetween, the second adjustment mechanism comprising:
    a second conductive shaft extending through the sidewall at a point substantially opposite the first conductive shaft and having a distal end attached to the second electrode; and
    a second adjusting wheel interengaged with the second shaft such that rotation of the second wheel is translated into axial reciprocation of the second shaft relative to the vessel;
    wherein the second adjusting wheel is mounted to the vessel, with convolutions in the second adjusting wheel meshing with convolutions in the vessel.

4. The test vessel assembly of claim 3, further comprising a second horn cover connected to the test vessel and shrouding a proximal end of the second conductive shaft, which proximal end is adapted to be conductively connected to a second electrical contact of an insulated horn within a test assembly to which the test vessel is mounted, in use, the second horn cover including convolutions that mesh with convolutions of the second adjusting wheel.

5. The test vessel assembly of claim 1, wherein the first adjustment mechanism includes a resilient member mounted to the proximal end of the respective shaft for urging the shaft, ergo the associated electrode, towards the other electrode.

6. The test vessel assembly of claim 5, in which the resilient member comprises a conductive spring, the assembly further comprising a conductive end cap connected to the proximal end of the associated shaft and encasing the spring.

7. The test vessel assembly of claim 1, further comprising a pin extending transversely through the first shaft, the pin received in an associated groove in the vessel so as to prevent rotation of the associated shaft whilst allowing the required axial reciprocation.

8. The test vessel assembly of claim 1, wherein at least one electrode is removably attached to the distal end of the conductive shaft.

9. The test vessel assembly of claim 1, wherein the first adjustment mechanism further comprises a lock for releasably preventing rotation of the adjusting wheel, thereby preventing reciprocal movement of the conductive shaft.

10. The test vessel assembly of claim 1, wherein the first adjusting wheel is concentrically arranged about the respective shaft.

11. The test vessel assembly of claim 10, wherein the first adjusting wheel is rotatably free, yet axially fixed to the associated shaft, and mounted by a threaded interconnection to the vessel.

12. The test vessel assembly of claim 10, wherein the first adjusting wheel is rotatably free, yet axially fixed to the vessel, and mounted by a threaded interconnection to the associated shaft.

* * * * *